(12) United States Patent
Kallio et al.

(10) Patent No.: US 12,014,527 B2
(45) Date of Patent: Jun. 18, 2024

(54) DELTA TRIPLET INDEX COMPRESSION

(71) Applicant: Advanced Micro Devices, Inc., Santa Clara, CA (US)

(72) Inventors: Kiia Kallio, Inkoo As (FI); Mika Tuomi, Noormarkku (FI); Ruijin Wu, San Diego, CA (US); Anirudh R. Acharya, San Diego, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 624 days.

(21) Appl. No.: 17/187,625

(22) Filed: Feb. 26, 2021

(65) Prior Publication Data

US 2021/0398325 A1    Dec. 23, 2021

Related U.S. Application Data

(60) Provisional application No. 63/042,384, filed on Jun. 22, 2020.

(51) Int. Cl.
| | |
|---|---|
| *G06T 9/00* | (2006.01) |
| *G06T 3/40* | (2006.01) |
| *G06T 17/10* | (2006.01) |
| *G06T 17/20* | (2006.01) |
| *H03M 7/30* | (2006.01) |
| *H03M 7/42* | (2006.01) |

(52) U.S. Cl.
CPC ............ *G06T 9/001* (2013.01); *G06T 3/40* (2013.01); *G06T 17/10* (2013.01); *G06T 17/20* (2013.01); *H03M 7/42* (2013.01); *H03M 7/6005* (2013.01); *H03M 7/6011* (2013.01)

(58) Field of Classification Search
CPC   G06T 9/001; G06T 17/10; G06T 3/40; G06T 17/20; H03M 7/42; H03M 7/6005; H03M 7/6011; H03M 7/30
See application file for complete search history.

(56) References Cited

U.S. PATENT DOCUMENTS

| | | |
|---|---|---|
| 8,493,381 B1 | 7/2013 | Tuoma et al. |
| 2002/0050992 A1 | 5/2002 | Deering |
| 2003/0184555 A1* | 10/2003 | Fraser ............... G06T 9/001 345/582 |
| 2005/0138279 A1 | 6/2005 | Somasundaram |
| 2014/0354666 A1 | 12/2014 | Yang |
| 2018/0232849 A1 | 8/2018 | Fuller et al. |

* cited by examiner

*Primary Examiner* — Jeffery A Brier
(74) *Attorney, Agent, or Firm* — Volpe Koenig

(57) ABSTRACT

Methods, devices, and systems for compressing and decompressing a stream of indices associated with graphics primitives. A group of delta values is determined based on a group of indices of the stream of indices. The group of delta values is compared to delta values in a lookup table. The group of indices is compressed based on an entry in the lookup table if the group of delta values matches all delta values in the entry, otherwise, the group of indices is compressed based on variable-length encoding.

20 Claims, 9 Drawing Sheets

DELTA TRIPLET INDEX COMPRESSION

CROSS-REFERENCE TO RELATED APPLICATIONS

This application claims the benefit of U.S. Provisional Patent Application No. 63/042,384 filed Jun. 22, 2020 and is incorporated by reference as if fully set forth herein.

BACKGROUND

In computer graphics, objects are typically represented three-dimensional (3D) space as a group of two-dimensional (2D) polygons, which are typically referred to as primitives in this context. The polygons are typically triangles, each having three vertices. Other types of polygon primitives may be used, however triangles are typically the most common. Each vertex includes information defining a position in 3D space, and typically includes other information such as color, normal vector, and/or texture information, for example.

A vertex can be part of more than one triangle (or other primitive). For example, two triangles with a common edge share two vertices. A plurality of triangles sharing various common edges to describe an object is referred to as a mesh, or a triangle mesh, in some cases. In order to reduce the amount of information required to represent the vertices, it is typically useful to reference each vertex by an index value rather than referencing its entire 3D coordinates, color, and/or other information. Index data is widely used to specify primitive connectivity.

In an example, a first triangle in the stream includes three vertices referenced by indices 0, 1, and 2. The next triangle in the stream, adjoining the first triangle, includes three vertices referenced by indices 1, 2, and 3. Here, the triangles share a common edge, defined by vertices corresponding to indices 1 and 2. Thus, the two triangles are represented by only four unique vertices, and the vertices indexed by 1 and 2 are reused. Indices are always integer values.

BRIEF DESCRIPTION OF THE DRAWINGS

A more detailed understanding can be had from the following description, given by way of example in conjunction with the accompanying drawings wherein.

DETAILED DESCRIPTION

Figure 1:
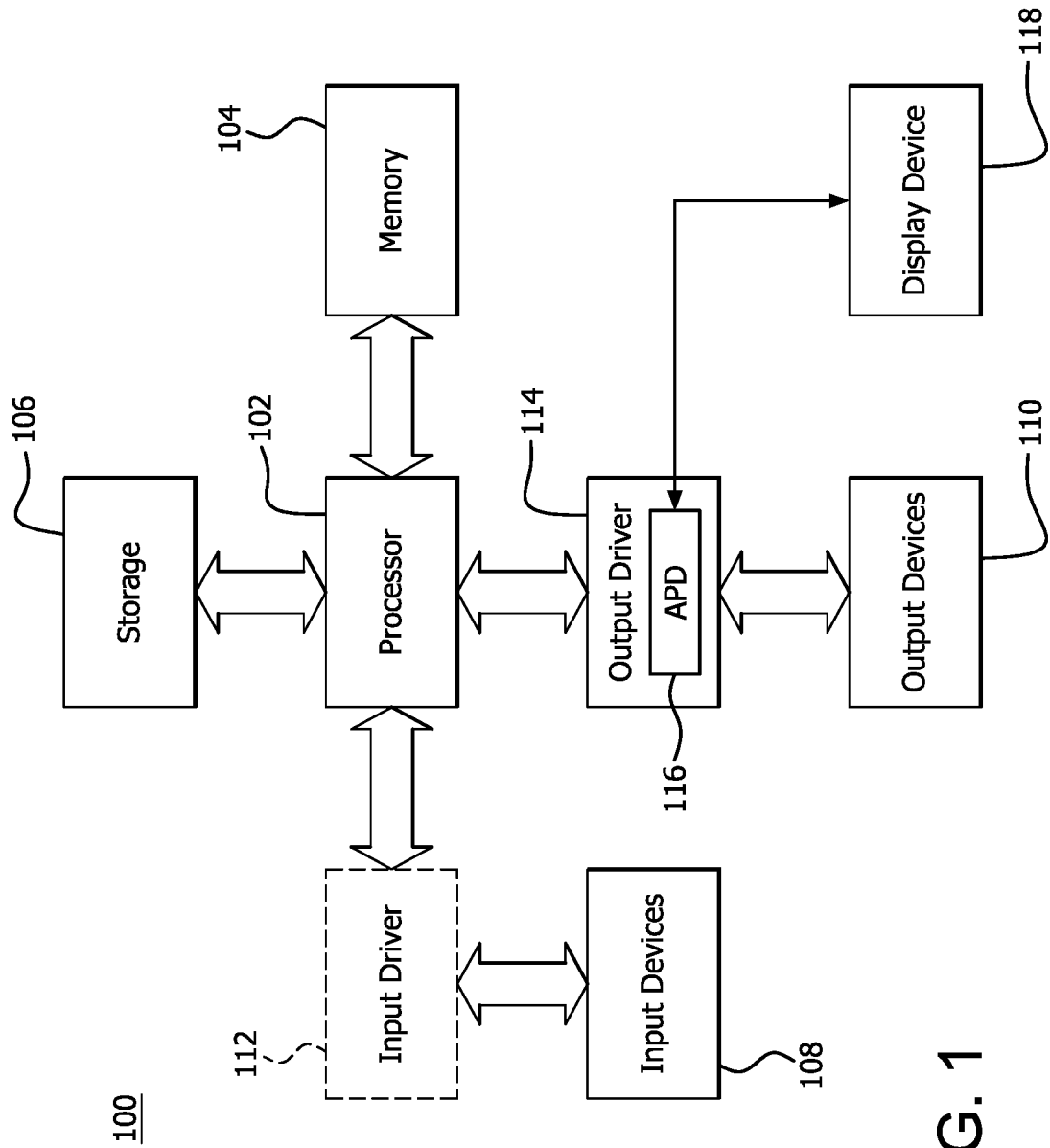
FIG. 1 is a block diagram of an example device in which one or more features of the disclosure can be implemented.

Some implementations provide a method for compressing a stream of indices associated with graphics primitives. A group of delta values is determined based on a group of indices of the stream of indices. The group of delta values is compared to delta values in a lookup table. The group of indices is compressed based on an entry in the lookup table if the group of delta values matches all delta values in the entry, otherwise, the group of indices is compressed based on variable-length encoding.

In some implementations, if the group of delta values includes at least one value matching a delta value in an entry in the lookup table, and includes at least one value not matching any delta values in the entry, and the at least one value not matching any delta values in the entry corresponds to a don't-care value in the entry, the group of indices is compressed based on the entry and based on variable-length encoding of the at least one value not matching any delta values in the entry.

In some implementations, if the group of delta values does not include at least one value matching a delta value in an entry in the lookup table, the group of indices is compressed based on an entry in the lookup table which includes only don't-care values, and based on variable-length encoding of each of the delta values. In some implementations, the group of indices is a triplet and the graphics primitives are triangles. In some implementations, the stream of indices indexes vertices of a mesh.

Some implementations provide a method for decompressing a compressed stream of indices associated with graphics primitives. A compressed group of indices of the compressed stream of indices is compared to entries of a lookup table. If the compressed group of indices matches a lookup table entry that includes delta values corresponding to each of the compressed group of indices, the compressed group of indices is decompressed based on the delta values, otherwise, the compressed group of indices is decompressed based on variable-length decoding.

In some implementations, if the compressed group of indices matches a lookup table entry that includes at least one delta value corresponding to at least one of the compressed group of indices, and includes at least one don't-care value corresponding to at least one of the compressed group of indices, the compressed group of indices is decompressed based on the at least one delta value and based on variable-length decoding of a delta value corresponding to the at least one don't-care value.

In some implementations, if the compressed group of indices matches a lookup table entry that includes only don't-care values, the compressed group of indices is decompressed based on variable-length decoding of delta values corresponding to each of the compressed group of indices. In some implementations, the compressed group of indices is a triplet and the graphics primitives are triangles. In some implementations, the compressed stream of indices indexes vertices of a mesh.

Some implementations provide a compressor configured to compress a stream of indices associated with graphics primitives. The compressor includes circuitry configured to determine a group of delta values based on a group of indices of the stream of indices. The compressor also includes circuitry configured to compare the group of delta values to delta values in a lookup table. The compressor also includes circuitry configured to compress the group of indices based on an entry in the lookup table if the group of delta values matches all delta values in the entry, otherwise to compress the group of indices based on variable-length encoding.

In some implementations, the compressor includes circuitry configured to, if the group of delta values includes at least one value matching a delta value in an entry in the lookup table, and includes at least one value not matching any delta values in the entry, wherein the at least one value not matching any delta values in the entry corresponds to a don't-care value in the entry, compress the group of indices based on the entry and based on variable-length encoding of the at least one value not matching any delta values in the entry.

In some implementations, the compressor includes circuitry configured to, if the group of delta values does not include at least one value matching a delta value in an entry in the lookup table, compress the group of indices based on an entry in the lookup table which includes only don't-care values, and based on variable-length encoding of each of the delta values. In some implementations, the group of indices is a triplet and the graphics primitives are triangles. In some implementations, the stream of indices indexes vertices of a mesh.

Some implementations provide a decompressor configured to decompress a compressed stream of indices associated with graphics primitives. The decompressor includes circuitry configured to compare a compressed group of indices of the compressed stream of indices to entries of a lookup table. The decompressor also includes circuitry configured to, if the compressed group of indices matches a lookup table entry that includes delta values corresponding to each of the compressed group of indices, decompress the compressed group of indices based on the delta values, otherwise to decompress the compressed group of indices based on variable-length decoding.

In some implementations, the decompressor includes circuitry configured to, if the compressed group of indices matches a lookup table entry that includes at least one delta value corresponding to at least one of the compressed group of indices, and includes at least one don't-care value corresponding to at least one of the compressed group of indices, decompress the compressed group of indices based on the at least one delta value and based on variable-length decoding of a delta value corresponding to the at least one don't-care value.

In some implementations, the decompressor includes circuitry configured to, if the compressed group of indices matches a lookup table entry that includes only don't-care values, decompress the compressed group of indices based on variable-length decoding of delta values corresponding to each of the compressed group of indices. In some implementations, the compressed group of indices is a triplet and the graphics primitives are triangles. In some implementations, the compressed stream of indices indexes vertices of a mesh.

Some implementations provide systems, devices, and methods for compressing indices in a stream of indices representing vertices in a triangle mesh. A stream of indices is input and a delta value triplet is calculated based on an index value triplet from the stream of indices. If the delta value triplet corresponds to a pattern identifier (ID) in a common pattern lookup table, the index value triplet is represented by the pattern ID. If the delta value triplet does not correspond to any pattern ID in the common pattern lookup table, the index value triplet is represented by the delta value triplet.

In some implementations, if the delta value triplet does not correspond to any pattern ID in the common pattern lookup table, the delta triplet is encoded and the index value triplet is represented by the encoded delta triplet. In some implementations, the encoded delta value triplet is encoded using variable length encoding.

FIG. 1 is a block diagram of an example device 100 in which one or more features of the disclosure can be implemented. The device 100 can include, for example, a computer, a gaming device, a handheld device, a set-top box, a television, a mobile phone, or a tablet computer. The device 100 includes a processor 102, a memory 104, a storage 106, one or more input devices 108, and one or more output devices 110. The device 100 can also optionally include an input driver 112 and an output driver 114. It is understood that the device 100 can include additional components not shown in FIG. 1.

In various alternatives, the processor 102 includes a central processing unit (CPU), a graphics processing unit (GPU), a CPU and GPU located on the same die, or one or more processor cores, wherein each processor core can be a CPU or a GPU. In various alternatives, the memory 104 is located on the same die as the processor 102, or is located separately from the processor 102. The memory 104 includes a volatile or non-volatile memory, for example, random access memory (RAM), dynamic RAM, or a cache.

The storage 106 includes a fixed or removable storage, for example, a hard disk drive, a solid state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present. The output driver 116 includes an accelerated processing device ("APD") 116 which is coupled to a display device 118. The APD accepts compute commands and graphics rendering commands from processor 102, processes those compute and graphics rendering commands, and provides pixel output to display device 118 for display. As described in further detail below, the APD 116 includes one or more parallel processing units to perform computations in accordance with a single-instruction-multiple-data ("SIMD") paradigm. Thus, although various functionality is described herein as being performed by or in conjunction with the APD 116, in various alternatives, the functionality described as being performed by the APD 116 is additionally or alternatively performed by other computing devices having similar capabilities that are not driven by a host processor (e.g., processor 102) and provides graphical output to a display device 118. For example, it is contemplated that any processing system that performs processing tasks in accordance with a SIMD paradigm may perform the functionality described herein. Alternatively, it is contemplated that computing systems that do not perform processing tasks in accordance with a SIMD paradigm performs the functionality described herein.

Figure 2:
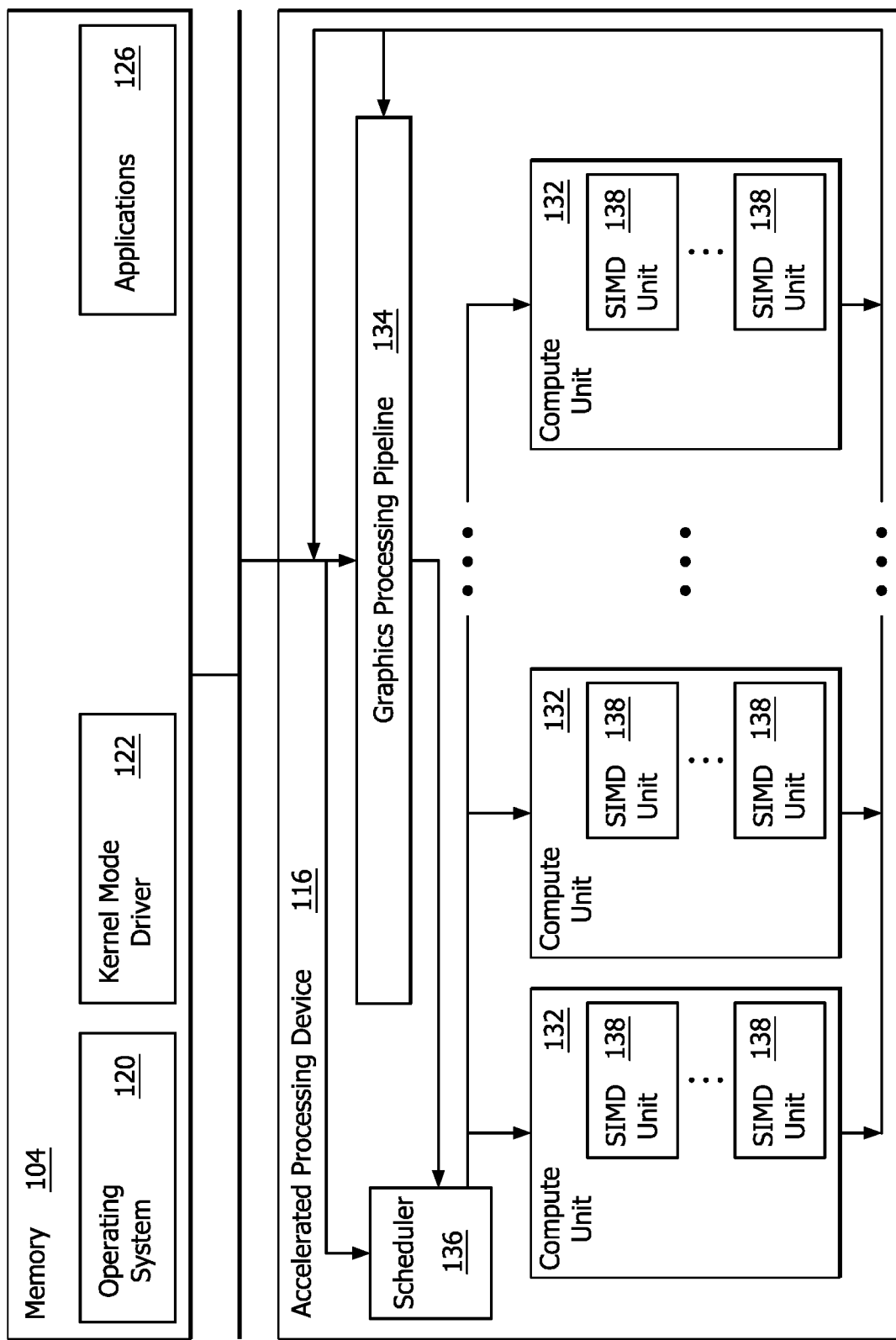
FIG. 2 is a block diagram of the device of FIG. 1, illustrating additional detail.

FIG. 2 is a block diagram of the device 100, illustrating additional details related to execution of processing tasks on the APD 116. The processor 102 maintains, in system memory 104, one or more control logic modules for execution by the processor 102. The control logic modules include an operating system 120, a kernel mode driver 122, and applications 126. These control logic modules control various features of the operation of the processor 102 and the APD 116. For example, the operating system 120 directly communicates with hardware and provides an interface to the hardware for other software executing on the processor 102. The kernel mode driver 122 controls operation of the APD 116 by, for example, providing an application programming interface ("API") to software (e.g., applications 126) executing on the processor 102 to access various functionality of the APD 116. The kernel mode driver 122 also includes a just-in-time compiler that compiles programs for execution by processing components (such as the SIMD units 138 discussed in further detail below) of the APD 116.

The APD 116 executes commands and programs for selected functions, such as graphics operations and non-graphics operations that may be suited for parallel processing. The APD 116 can be used for executing graphics pipeline operations such as pixel operations, geometric computations, and rendering an image to display device 118 based on commands received from the processor 102. The APD 116 also executes compute processing operations that are not directly related to graphics operations, such as operations related to video, physics simulations, computational fluid dynamics, or other tasks, based on commands received from the processor 102.

The APD 116 includes compute units 132 that include one or more SIMD units 138 that perform operations at the request of the processor 102 in a parallel manner according to a SIMD paradigm. The SIMD paradigm is one in which multiple processing elements share a single program control flow unit and program counter and thus execute the same program but are able to execute that program with different data. In one example, each SIMD unit 138 includes sixteen lanes, where each lane executes the same instruction at the same time as the other lanes in the SIMD unit 138 but can execute that instruction with different data. Lanes can be switched off with predication if not all lanes need to execute a given instruction. Predication can also be used to execute programs with divergent control flow. More specifically, for programs with conditional branches or other instructions where control flow is based on calculations performed by an individual lane, predication of lanes corresponding to control flow paths not currently being executed, and serial execution of different control flow paths allows for arbitrary control flow.

The basic unit of execution in compute units 132 is a work-item. Each work-item represents a single instantiation of a program that is to be executed in parallel in a particular lane. Work-items can be executed simultaneously as a "wavefront" on a single SIMD processing unit 138. One or more wavefronts are included in a "work group," which includes a collection of work-items designated to execute the same program. A work group can be executed by executing each of the wavefronts that make up the work group. In alternatives, the wavefronts are executed sequentially on a single SIMD unit 138 or partially or fully in parallel on different SIMD units 138. Wavefronts can be thought of as the largest collection of work-items that can be executed simultaneously on a single SIMD unit 138. Thus, if commands received from the processor 102 indicate that a particular program is to be parallelized to such a degree that the program cannot execute on a single SIMD unit 138 simultaneously, then that program is broken up into wavefronts which are parallelized on two or more SIMD units 138 or serialized on the same SIMD unit 138 (or both parallelized and serialized as needed). A scheduler 136 performs operations related to scheduling various wavefronts on different compute units 132 and SIMD units 138.

The parallelism afforded by the compute units 132 is suitable for graphics related operations such as pixel value calculations, vertex transformations, and other graphics operations. Thus in some instances, a graphics pipeline 134, which accepts graphics processing commands from the processor 102, provides computation tasks to the compute units 132 for execution in parallel.

The compute units 132 are also used to perform computation tasks not related to graphics or not performed as part of the "normal" operation of a graphics pipeline 134 (e.g., custom operations performed to supplement processing performed for operation of the graphics pipeline 134). An application 126 or other software executing on the processor 102 transmits programs that define such computation tasks to the APD 116 for execution.

Figure 3:
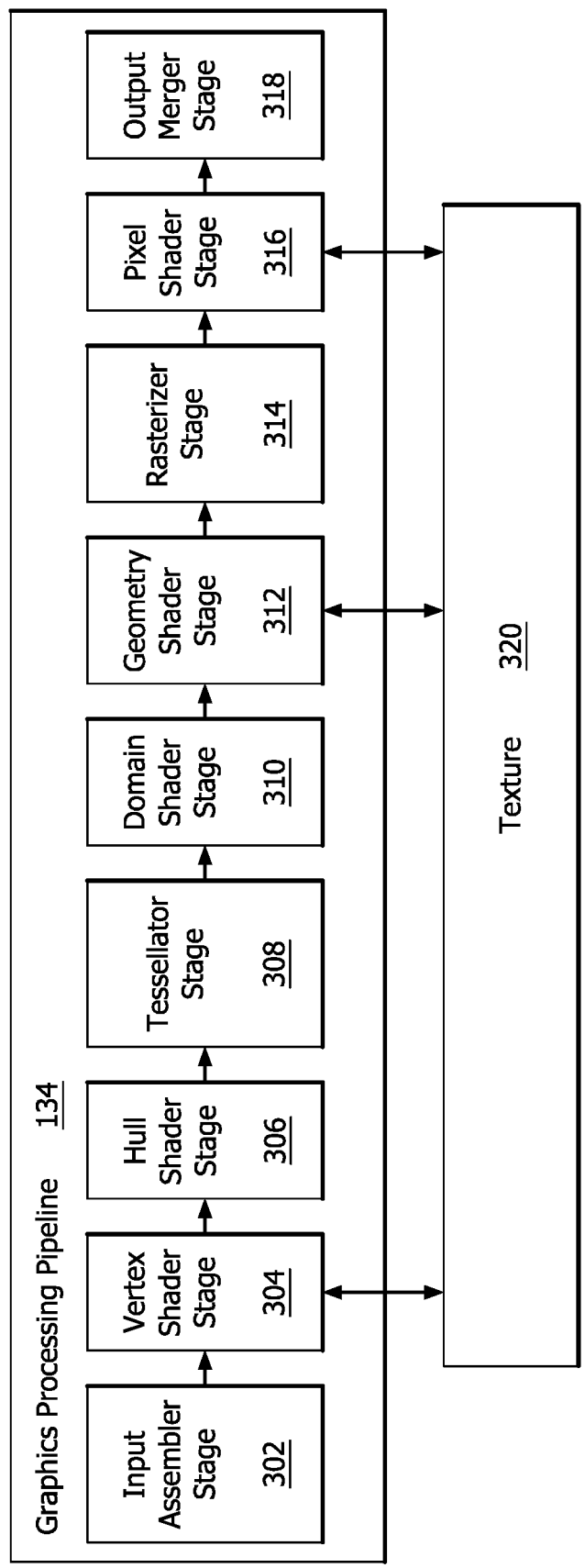
FIG. 3 is a block diagram illustrating a graphics processing pipeline, according to an example

FIG. 3 is a block diagram showing additional details of the graphics processing pipeline 134 illustrated in FIG. 2. The graphics processing pipeline 134 includes stages that each performs specific functionality. The stages represent subdivisions of functionality of the graphics processing pipeline 134. Each stage is implemented partially or fully as shader programs executing in compute units 132, or partially or fully as fixed-function, non-programmable hardware external to the compute units 132.

The input assembler stage 302 reads primitive data from user-filled buffers (e.g., buffers filled at the request of software executed by the processor 102, such as an application 126) and assembles the data into primitives for use by the remainder of the pipeline. The input assembler stage 302 can generate different types of primitives based on the primitive data included in the user-filled buffers. The input assembler stage 302 formats the assembled primitives for use by the rest of the pipeline.

The vertex shader stage 304 processes vertexes of the primitives assembled by the input assembler stage 302. The vertex shader stage 304 performs various per-vertex operations such as transformations, skinning, morphing, and per-vertex lighting. Transformation operations include various operations to transform the coordinates of the vertices. These operations include one or more of modeling transformations, viewing transformations, projection transformations, perspective division, and viewport transformations. Herein, such transformations are considered to modify the coordinates or "position" of the vertices on which the transforms are performed. Other operations of the vertex shader stage 304 modify attributes other than the coordinates.

The vertex shader stage 304 is implemented partially or fully as vertex shader programs to be executed on one or more compute units 132. The vertex shader programs are provided by the processor 102 and are based on programs that are pre-written by a computer programmer. The driver 122 compiles such computer programs to generate the vertex shader programs having a format suitable for execution within the compute units 132.

The hull shader stage 306, tessellator stage 308, and domain shader stage 310 work together to implement tessellation, which converts simple primitives into more complex primitives by subdividing the primitives. The hull shader stage 306 generates a patch for the tessellation based on an input primitive. The tessellator stage 308 generates a set of samples for the patch. The domain shader stage 310 calculates vertex positions for the vertices corresponding to the samples for the patch. The hull shader stage 306 and domain shader stage 310 can be implemented as shader programs to be executed on the compute units 132.

The geometry shader stage 312 performs vertex operations on a primitive-by-primitive basis. A variety of different types of operations can be performed by the geometry shader stage 312, including operations such as point sprint expansion, dynamic particle system operations, fur-fin generation, shadow volume generation, single pass render-to-cubemap, per-primitive material swapping, and per-primitive material setup. In some instances, a shader program that executes on the compute units 132 perform operations for the geometry shader stage 312.

The rasterizer stage 314 accepts and rasterizes simple primitives and generated upstream. Rasterization consists of determining which screen pixels (or sub-pixel samples) are covered by a particular primitive. Rasterization is performed by fixed function hardware.

The pixel shader stage 316 calculates output values for screen pixels based on the primitives generated upstream and the results of rasterization. The pixel shader stage 316 may apply textures from texture memory. Operations for the pixel shader stage 316 are performed by a shader program that executes on the compute units 132.

The output merger stage 318 accepts output from the pixel shader stage 316 and merges those outputs, performing operations such as z-testing and alpha blending to determine the final color for a screen pixel.

Texture data, which defines textures, are stored and/or accessed by the texture unit 320. Textures are bitmap images that are used at various points in the graphics processing pipeline 134. For example, in some instances, the pixel shader stage 316 applies textures to pixels to improve apparent rendering complexity (e.g., to provide a more "photorealistic" look) without increasing the number of vertices to be rendered.

In some instances, the vertex shader stage 304 uses texture data from the texture unit 320 to modify primitives to increase complexity, by, for example, creating or modifying vertices for improved aesthetics. In one example, the vertex shader stage 304 uses a height map stored in the texture unit 320 to modify displacement of vertices. This type of technique can be used, for example, to generate more realistic looking water as compared with textures only being used in the pixel shader stage 316, by modifying the position and number of vertices used to render the water. In some instances, the geometry shader stage 312 accesses texture data from the texture unit 320.

Index data is widely used in computer graphics to specify primitive connectivity. For example, objects are typically specified as a stream of indices, beginning with a starting vertex, then proceeding to the other vertices of the first polygon, and on to indices of adjoining polygons which share common vertices, until the object is fully defined.

In some cases, it is desirable to compress the stream of indices. For example, in "traditional" dual-pass rendering (e.g., separate z-pass and render pass, controlled by software), it may be advantageous to store primitives surviving the z-pass as a compressed index stream. In some such cases, the compressed index stream is usable as index data during the render pass instead of the original index buffer. Example cases where this approach may be applicable include where the geometry for z-pass and render pass is the same.

In some cases, it is desirable to compress the stream of indices to reduce storage and bandwidth used in processing the indices. Index buffers are often reused without modification. However, in some cases, several versions of the index buffer are used. In a landscape rendering example, multiple index buffers access the landscape vertices at different levels of detail (LOD). In another example, multiple index buffers are used for different viewing angles, where landscape features not viewable from specific angles are removed from some of the index buffers. Accordingly, it is advantageous, in some such cases, to compress the multiple index buffers in order to save storage space and/or memory bandwidth in some circumstances.

In some cases, index data is streamed within the graphics pipeline from the beginning of the geometry processing to a hardware unit later in the pipeline. In some such cases, a regular buffer (e.g., first-in-first out (FIFO) buffer) for the indices would require a considerable amount of hardware to store the index data. Accordingly, in some such cases, it is desirable to compress the index stream (e.g., using triplet compression as discussed herein) to reduce the amount of storage used to store the index stream. In some such cases, a parallel variation of the compression can be used (i.e. compressing or decompressing multiple primitives in parallel for larger primitive throughput).

Because the number values of consecutive indices in the stream are typically fairly close in number due to the spatial locality in the way they are typically constructed, the index stream typically exhibits substantial temporal locality (i.e., the numbers are close in value, such as within a threshold value of one another). For example, considering one index in the stream, surrounding indices (e.g., previous and/or subsequent indices, such as immediately previous, and/or immediately subsequent indices) typically have values that are close in value (e.g., within a threshold number). In some implementations, this property yields compressibility that is exploited to reduce geometry data size. In some implementations, it is possible to further compress the index stream by compressing patterns of indices within the stream.

Various primitives are used in computer graphics. For example, it is possible to render a line, which is defined by two vertices, or a quad, which is defined by four vertices. In some implementations, the most common primitive is a triangle, represented by three vertices. Accordingly, it may be desired to break an index stream representing the vertices of triangle primitives into triplets (i.e., groups of three vertices, or indices) for compression purposes. It is noted that the techniques, devices, and systems herein are also applicable to other primitives, e.g., by breaking the index stream into groups of other numbers of vertices. For example, it may be desired to break an index stream representing the vertices of quad primitives into quadruplets (i.e., groups of four vertices, or indices) for compression purposes. Although the examples herein are described with respect to the triangle/triplet case, it is noted that adaptation to different numbers of vertices is contemplated, e.g., by breaking the index stream into groups of other numbers of vertices. Further, it is noted that special cases arise in an index stream. For example, triangle meshes are typically aligned as triplets. However, some implementations include patch primitives. In some cases, patch primitives include more than three indices per primitive. Further, some implementations include point primitives (one index per primitive) and line primitives (two indices per primitive) that are not aligned by triplet. Accordingly, in an example where a mesh includes 7 primitives having 5 indices each, the total number of indices is 35. The 35 indices are representable as 11 triplets (=33 indices) and a 2-index entry at the end for aligning to 35. Alternatively, the data is represented such that each primitive includes a single triplet and another 2-index entry, so that the data is aligned by 5. Here, each primitive has 5 indices, and there are 7 primitives. Accordingly, the data can be stored as 7×(3+2); i.e., each primitive is stored as a triplet and a group which includes only two indices. Alternatively, the data is stored as a long sequence of triplets, and the last entry aligns the amount of data with the number of stored entries (e.g., 11×3+2 for eleven triplets, and one special case at the end).

Because each vertex is indexed by a different value, the numbers do not typically repeat in the index stream. However, an underlying pattern within the indices of a primitive is comparable between primitives. For example, the delta values (e.g., difference values) between and/or among indices in a primitive are comparable to the delta values between and/or among indices in another primitive, and may be the same, even if the index values are different. In this way, common patterns are identifiable in the index stream in some implementations.

Accordingly, in some implementations, the index stream is compressed based on delta values within and/or between index triplets (in the case of triangle primitives, or index quadruplets in the case of quad primitives, and so forth).

In some implementations, the compressed delta triplet stream is used in various operations as a compressed version of the index stream. In some implementations, the compressed delta triplet stream is used as a form of visibility. For example, in some implementations, the compressed delta triplet values are used instead of index values in a buffer (e.g., a "visibility buffer") which tracks which triangle is visible in a bin, tile, or other portion of a rendered screen. In some implementations, using compressed index data is advantageous for per-bin visibility information. For example, in some cases it may be advantageous to store per-primitive information such that when rendering the bin, it is unnecessary to process primitives that do not contribute to the bin in question. By constructing a compressed index stream, it is unnecessary to fetch visibility flags, and then sparse fetch to the index buffer based on the fetched visibility flag, since the compressed index stream provides the necessary information directly. This can have the advantage of reducing bandwidth and latency when rendering primitives. One way to store visibility information is to calculate a bit per primitive indicating whether the primitive is visible, and to store this information to memory, either in compressed or non-compressed form. Using this approach, in some cases, the process for fetching indices requires that first the visibility information is fetched, followed by a dependent fetch to the index data based on the visibility bit. In some implementations, according to this approach, the overall fetch latency is doubled, due to the requirement for two data fetch passes. In some implementations, there will also be an be over-fetch of the index data, as memory fetches are typically done in blocks of hundreds of bits, whereas the dependent fetch requires only a subset of the data in the index buffer, thus some portions of the data that is fetched will not be used as indices of visible primitives. Accordingly, some implementations generate compressed index data in memory that includes indices of visible primitives only. Thus, all fetched data will be used. In some such implementations, when writing visibility information, more data is generated for the compressed index stream, but less information is read using the compressed index stream, using a more convenient access pattern.

Figure 4:
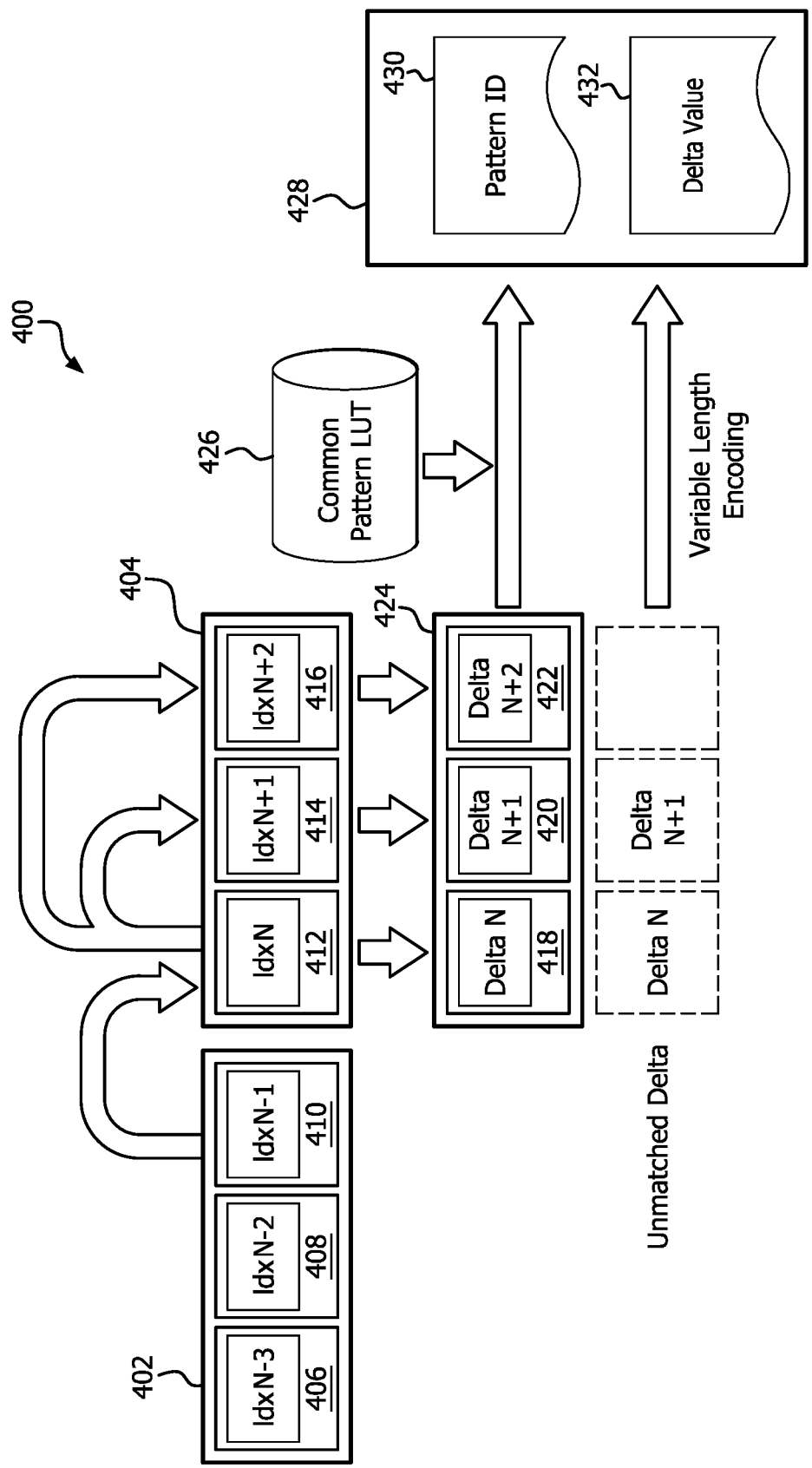
FIG. 4 is a flow diagram illustrating example triplet-based delta compression of an example index stream.

FIG. 4 is a flow diagram 400 illustrating example triplet-based delta compression of an example index stream. Flow diagram 400 illustrates a technique for compressing a stream of indices that is triplet based. This technique is optimized for the most common primitive type, which is a triangle with three vertices. Accordingly, in this technique, delta values (e.g., difference values) are calculated within a triplet of index values from the index stream to generate a delta triplet for the triplet of index values, and a lookup table captures the most common delta triplets of the stream. Index triplets corresponding to delta triplets that are captured in the lookup table (i.e., the most common patterns or delta triplets in the stream) are represented by a pattern identifier (ID) associated with the entry in the lookup table. Index triplets corresponding to delta triplets that are not captured in the lookup table are stored or encoded in another way, such as by applying variable length encoding to the delta triplet and representing the index triplet by the encoded value.

In some implementations, this technique yields an advantageously compressed representation of the index stream. In some implementations, this is due to temporal locality within the index stream that results in a relatively small number (e.g., below a threshold number or percentage) of patterns occurring within the delta stream, such that a relatively large number (e.g., above a threshold number or percentage) of delta triplets match entries in the common pattern lookup table.

In more detail, flow diagram 400 shows an index stream which includes six indices, broken into two index triplets 402, 404. Index triplet 402 includes indices 406, 408, 410, occupying positions N−3, N−2, and N−1 respectively. Index triplet 404 includes indices 412, 414, 416, occupying positions N, N+1, and N+2 respectively.

In some implementations, in order to compress index triplet 404, three delta values 418, 420, 422, corresponding to indices 412, 414, 416 respectively, are calculated based on the values of indices 412, 414, 416. For example, the delta value 418 is determined as (index 412)−(index 410); i.e., a difference between the value of index 412 and the value of index 410. Delta value 420 is calculated as (index 414)−(index 412); i.e., a difference between the value of index 414 and the value of index 412. Delta value 422 is calculated as (index 416)−(index 412); i.e., a difference between the value of index 416 and the value of index 412. Note, one of the three delta values (delta value 418 in this example) is based on an index value from the previous triplet, while the other two delta values (delta value 420 and delta value 422 in this example) are calculated from index values within the triplet. The three delta values, 418, 420, 422, are referred to as a delta triplet 424 for convenience.

After the values of delta triplet 424 have been determined, delta triplet 424 is compressed. In order to compress the delta triplet, the three delta values 418, 420, 422 are compared with values in a common pattern lookup table 426. The common pattern lookup table 426 is implemented in any suitable way, such as by a special purpose register in graphics hardware, and can be of any suitable size. In this example, common pattern lookup table 426 stores 15 patterns of delta values. In some implementations, the number of entries in the common pattern lookup table is based on a desired lookup speed, die area, and/or design complexity. Each of the patterns in the common pattern lookup table is associated with a pattern identifier (ID).

In some implementations, if delta values 418, 420, 422 in the delta triplet 424 (in order) match a common pattern in the common pattern lookup table 426, the index triplet 404 is compressed into a compressed representation 428 based on a pattern ID 430 corresponding to the common pattern matching the delta triplet 424. In some implementations, delta values 418, 420, 422 are not a part of the compressed representation 428 of index triplet 404 (apart from their expression in the pattern ID 430).

In some implementations, if delta values 418, 420, 422 in the delta triplet 424 (in order) do not match any common pattern in the common pattern lookup table 426, the index triplet 404 is represented in compressed representation 428 in another suitable way. For example, in some implementations, delta values 418, 420, 422 in delta triplet 424 are encoded in any suitable way, such as by variable length encoding, and the index triplet 404 is compressed into compressed representation 428 based on the encoded delta values 432.

In some implementations, this case is handled by matching delta values that would otherwise not match any common pattern in the common pattern lookup table 426 to an entry in the common pattern lookup table 426 where each delta value is a "don't care" value (i.e., matches any delta value). In some implementations, the index triplet 404 is compressed into compressed representation 428 based on a combination of the pattern ID 430 corresponding to this particular entry in the common pattern lookup table 426 and the encoded delta values 432.

In some implementations, if at least one, but less than all (i.e., one or two in the case of a triplet) of delta values 418, 420, 422 in the delta triplet 424 (in order) match a common pattern in the common pattern lookup table 426, the index triplet 404 is compressed into compressed representation 428 in another suitable way, such as based on a combination of a pattern ID and encoded delta values.

For example, in some implementations, common pattern lookup table 426 includes at least one common pattern whose triplet includes one or more specific delta values, and one or more "don't care" values. In such cases, the delta value or values of index triplet 404 which match the specified values are representable in compressed representation 428 based on pattern ID 430 corresponding to the common pattern, and the delta value or values of index triplet 404 which correspond to the "don't care" value or values are encoded in any suitable way, such as by variable length encoding, and the index triplet is represented by a combination of the pattern ID 430 corresponding to the common pattern and the encoded delta value or values 432.

In some implementations, the common pattern lookup table 426 is pre-populated (e.g., statically). In some implementations, the common pattern lookup table 426 is fixed, or is configurable. In some implementations, the pattern lookup table 426 is pre-populated with values determined by analyzing a set of training data (e.g., a set of data collected from application traces (e.g., empirically, i.e., from "real life" application traces)).

In some implementations, the common pattern lookup table 426 is populated during compression of an index stream by tracking the frequency of observed delta triplet values. In some implementations, after the lookup table is full (e.g., after 14 delta triplets or patterns are stored in a common pattern lookup table that has 14 entries) a least frequent delta triplet value or pattern is evicted from the common pattern lookup table if a different delta triplet value or pattern is observed by the common pattern lookup table hardware and/or software to occur in the delta stream with a greater frequency.

Figure 5:
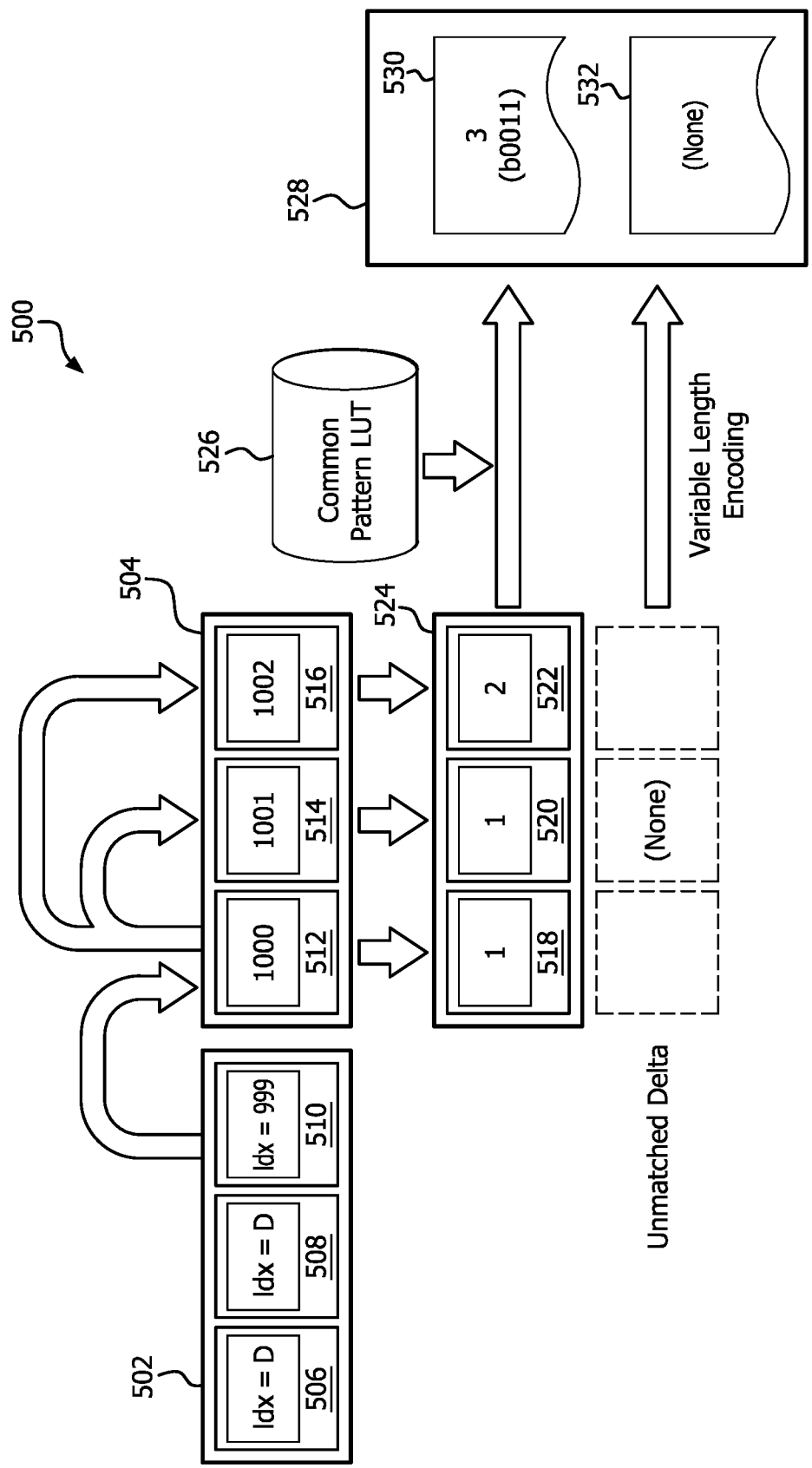
FIG. 5 is a flow diagram illustrating example triplet-based delta compression of an example index stream for an example case.

FIG. 5 is a flow diagram 500 illustrating example triplet-based delta compression of an example index stream for an example case where delta values of an example index triplet all match specific delta values of an entry in a common pattern lookup table.

In more detail, flow diagram 500 shows an index stream which includes six indices, broken into two index triplets 502, 504. Index triplet 502 includes indices 506, 508, 510. Index 510 has a value of 999 in this example. The values of indices 506 and 508 are not used in this example compression, and are simply indicated as "D" in the figure. Index triplet 504 includes indices 512, 514, 516, having values of 1000, 1001, and 1002 respectively.

In this example, in order to compress index triplet 504, three delta values 518, 520, 522, corresponding to indices 512, 514, 516 respectively, are calculated based on the values of indices 512, 514, 516. For example, the delta value 518 is determined as (index 512)−(index 510); i.e., (1000)−(999)=1. Delta value 520 is calculated as (index 514)−(index 512); i.e., (1001)−(1000)=1. Delta value 522 is calculated as (index 516)−(index 512); i.e., (1002)−(1000)=2. The three delta values, 518, 520, 522, are referred to as a delta triplet 524 for convenience.

After the values of delta triplet 524 have been determined, delta triplet 524 is compressed. In order to compress the delta triplet, the three delta values 518, 520, 522 are compared with values in common pattern lookup table 526. The common pattern lookup table 526 is implemented in any suitable way, such as by a special purpose register in graphics hardware, and can be of any suitable size. In this example, common pattern lookup table 526 stores 15 patterns of delta values. Table 1 illustrates the 15 patterns of delta values stored in example common pattern lookup table 526, and the corresponding pattern ID for each entry.

TABLE 1

| Pattern ID | Index 0 delta | Index 1 delta | Index 2 delta |
| --- | --- | --- | --- |
| 0 (b0000) | 0 | −1 | 1 |
| 1 (b0001) | 1 | 1 | 2 |
| 2 (b0010) | 2 | 1 | 2 |
| 3 (b0011) | 0 | 1 | 2 |
| 4 (b0100) | any | 1 | 2 |
| 5 (b0101) | any | −1 | 1 |
| 6 (b0110) | any | −2 | −1 |
| 7 (b0111) | any | −1 | −2 |
| 8 (b1000) | any | −1 | any |
| 9 (b1001) | any | 1 | any |
| 10 (b1010) | 0 | any | any |
| 11 (b1011) | any | −2 | any |
| 12 (b1100) | any | any | 1 |
| 13 (b1101) | any | any | −2 |
| 14 (b1110) | any | any | any |

In this example, delta values 518, 520, 522, in that order, match the pattern in common pattern lookup table 526 corresponding to pattern ID 3 (binary 0011). In this case, the index triplet 504 is compressed into compressed representation 528 based on pattern ID 530, which has a value of 3 (b0011). In this example, since each of delta values 518, 520, 522 is captured by the pattern ID, there is no "unmatched" delta, and accordingly, no encoded delta values 532 are used to generate compressed representation 528. In this example, the locality among the index values advantageously facilitates compression without the need for variable length encoding.

Figure 6:
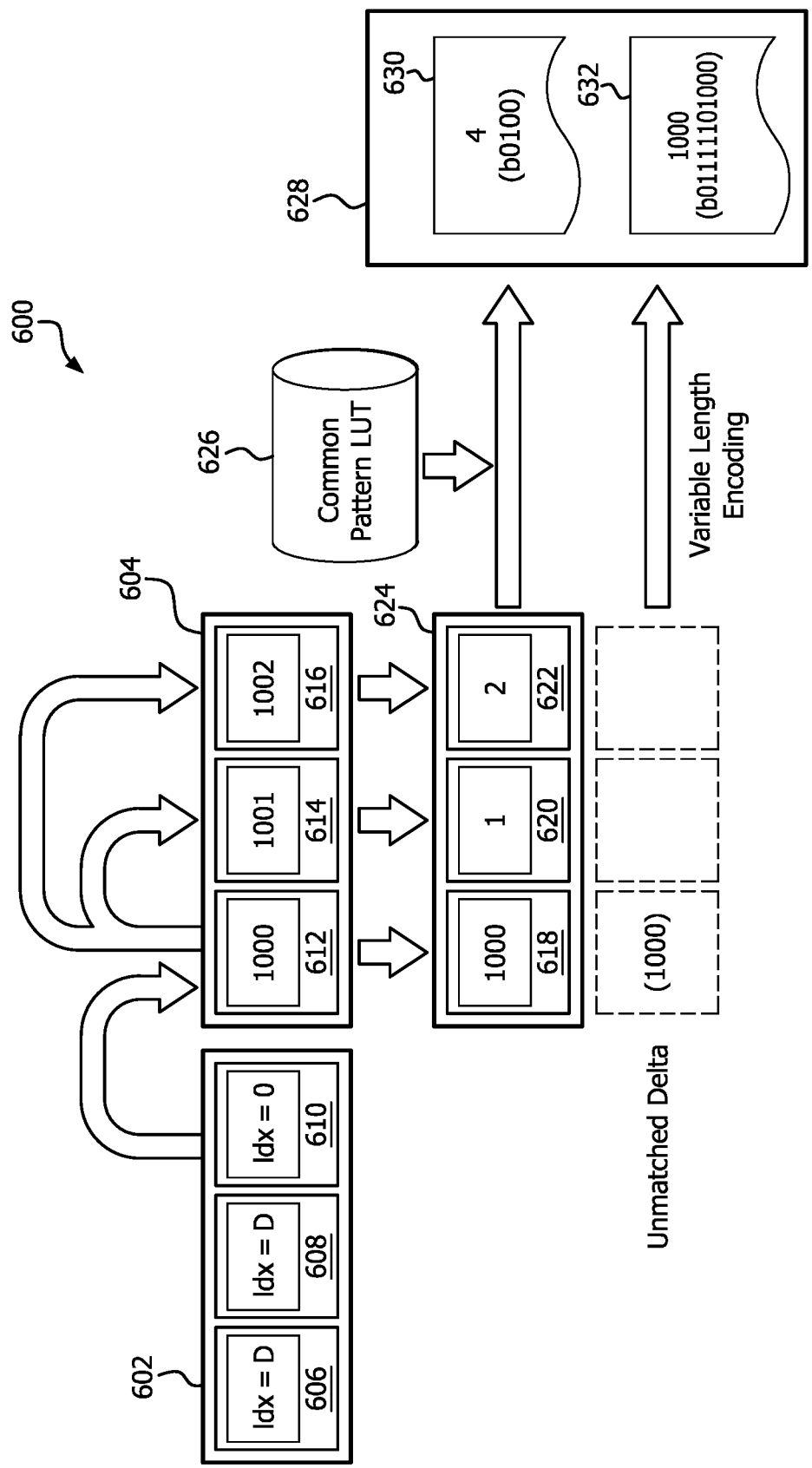
FIG. 6 is a flow diagram illustrating example triplet-based delta compression of an example index stream for another example case.

FIG. 6 is a flow diagram 600 illustrating example triplet-based delta compression of an example index stream for an example case where a subset of the delta values of an example index triplet match specific delta values of an entry in a common pattern lookup table, while the other delta values match a "don't care" value of the entry.

In more detail, flow diagram 600 shows an index stream which includes six indices, broken into two index triplets 602, 604. Index triplet 602 includes indices 606, 608, 610. Index 610 has a value of 0 in this example. The values of indices 606 and 608 are not used in this example compression, and are simply indicated as "D" in the figure. Index triplet 604 includes indices 612, 614, 616, having values of 1000, 1001, and 1002 respectively.

In this example, in order to compress index triplet 604, three delta values 618, 620, 622, corresponding to indices 612, 614, 616 respectively, are calculated based on the values of indices 612, 614, 616. For example, the delta value 618 is determined as (index 612)−(index 610); i.e., (1000)−(0)=1000. Delta value 620 is calculated as (index 614)−(index 612); i.e., (1001)−(1000)=1. Delta value 622 is calculated as (index 616)−(index 612); i.e., (1002)−(1000)=2. The three delta values, 618, 620, 622, are referred to as a delta triplet 624 for convenience.

After the values of delta triplet 624 have been determined, delta triplet 624 is compressed. In order to compress the delta triplet, the three delta values 618, 620, 622 are compared with values in common pattern lookup table 626. The common pattern lookup table 626 is implemented in any suitable way, such as by a special purpose register in graphics hardware, and can be of any suitable size. In this example, common pattern lookup table 626 stores 15 patterns of delta values. Table 1 illustrates the 15 patterns of delta values stored in example common pattern lookup table 626, and the corresponding pattern ID for each entry.

In this example, delta values 618, 620, 622, in that order, match the pattern in common pattern lookup table 626 corresponding to pattern ID 4 (binary 0100). In this case, the index triplet 604 is compressed into compressed representation 628 based on pattern ID 630, which has a value of 4 (b0100). In this example, two of the specific delta values 620, 622 are captured by the pattern ID, but delta value 618 is represented by a "don't care" entry, which would match to any delta value. Accordingly, the value of delta value 618 (1000, or b01111101000 including a sign bit) is "unmatched" and accordingly, these bits are encoded, e.g., using variable length encoding, as an encoded data value 632. A combination of pattern ID 630 and the encoded data value 632 is used to generate compressed representation 628. In this example, the locality among some of the index values advantageously facilitates compression without the need for variable length encoding of all of the delta values, however some encoding supplements the compression due to the large difference in value between index 610 and index 612.

Figure 7:
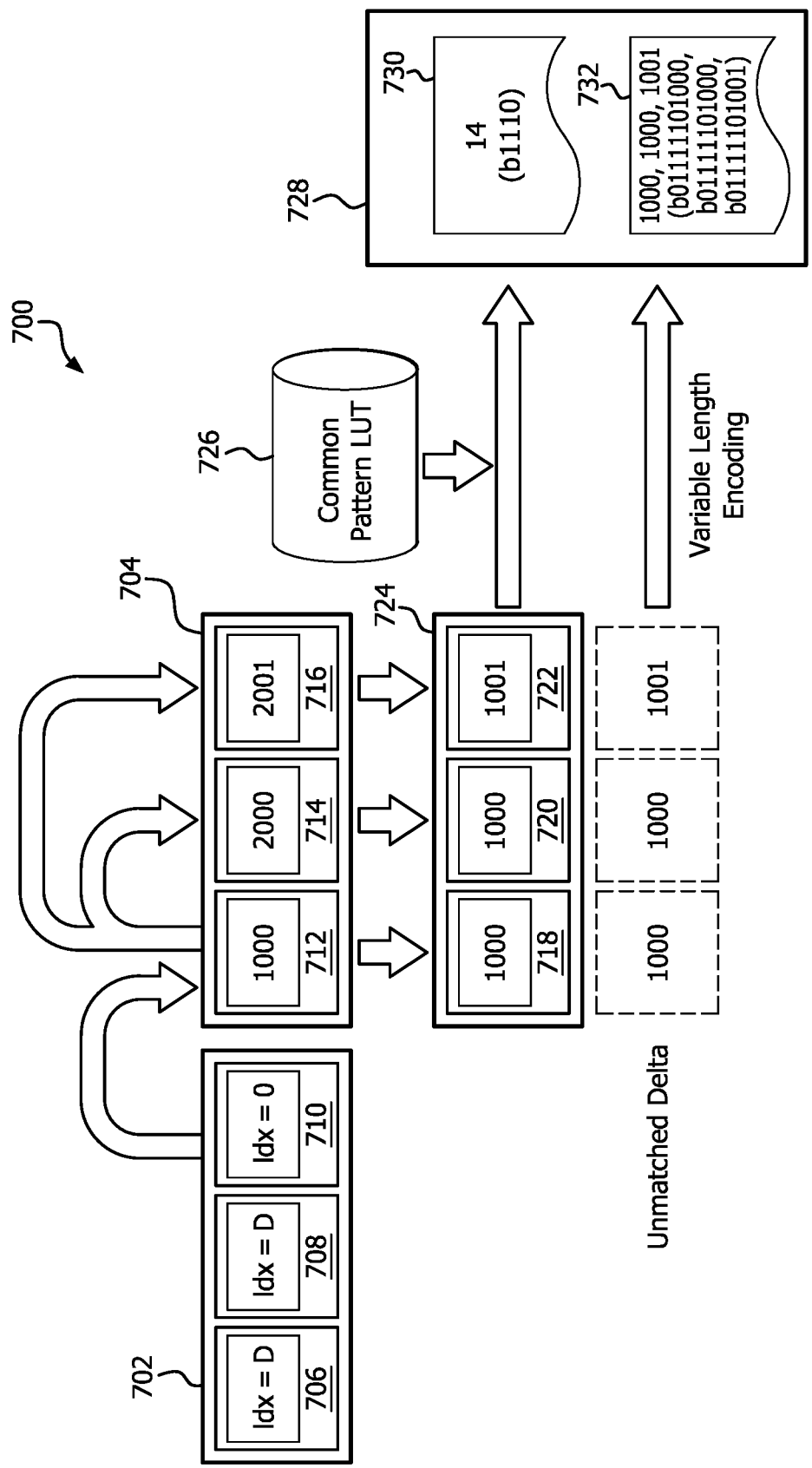
FIG. 7 is a flow diagram illustrating example triplet-based delta compression of an example index stream for another example case.

FIG. 7 is a flow diagram 700 illustrating example triplet-based delta compression of an example index stream for an example case where none of the delta values of an example index triplet match specific delta values of an entry in a common pattern lookup table, but rather, are matched to an entry having three "don't care" values.

In more detail, flow diagram 700 shows an index stream which includes six indices, broken into two index triplets 702, 704. Index triplet 702 includes indices 706, 708, 710. Index 710 has a value of 0 in this example. The values of indices 706 and 708 are not used in this example compression, and are simply indicated as "D" in the figure. Index triplet 704 includes indices 712, 714, 716, having values of 1000, 2000, and 2001 respectively.

In this example, in order to compress index triplet 704, three delta values 718, 720, 722, corresponding to indices 712, 714, 716 respectively, are calculated based on the values of indices 712, 714, 716. For example, the delta value 718 is determined as (index 712)−(index 710); i.e., (1000)−(0)=1000. Delta value 720 is calculated as (index 714)−(index 712); i.e., (2000)−(1000)=1000. Delta value 722 is calculated as (index 716)−(index 712); i.e., (2001)−(1000)=1001. The three delta values, 718, 720, 722, are referred to as a delta triplet 724 for convenience.

After the values of delta triplet 724 have been determined, delta triplet 724 is compressed. In order to compress the delta triplet, the three delta values 718, 720, 722 are compared with values in common pattern lookup table 726. The common pattern lookup table 726 is implemented in any suitable way, such as by a special purpose register in graphics hardware, and can be of any suitable size. In this example, common pattern lookup table 726 stores 15 patterns of delta values. Table 1 illustrates the 15 patterns of delta values stored in example common pattern lookup table 726, and the corresponding pattern ID for each entry.

In this example, delta values 718, 720, 722, in that order, match the pattern in common pattern lookup table 726 corresponding to pattern ID 14 (binary 1110). In this case, the index triplet 704 is compressed into compressed representation 728 based on pattern ID 730, which has a value of 14 (b1110). In this example, none of the specific delta values 718, 720, 722 are captured by the pattern ID, but all of the delta values 718, 720, 722 is represented by a "don't care" entry, which would match to any delta value. Accordingly, the value of delta values 718, 720, 722 (1000, 2000, 2001) are all "unmatched" and accordingly, are all encoded, e.g., using variable length encoding, as an encoded data value 732. A combination of pattern ID 730 and the encoded data value 732 is used to generate compressed representation 728. In this example, the relative lack of locality among some of the index values requires variable length encoding of all of the delta values.

Figure 8:
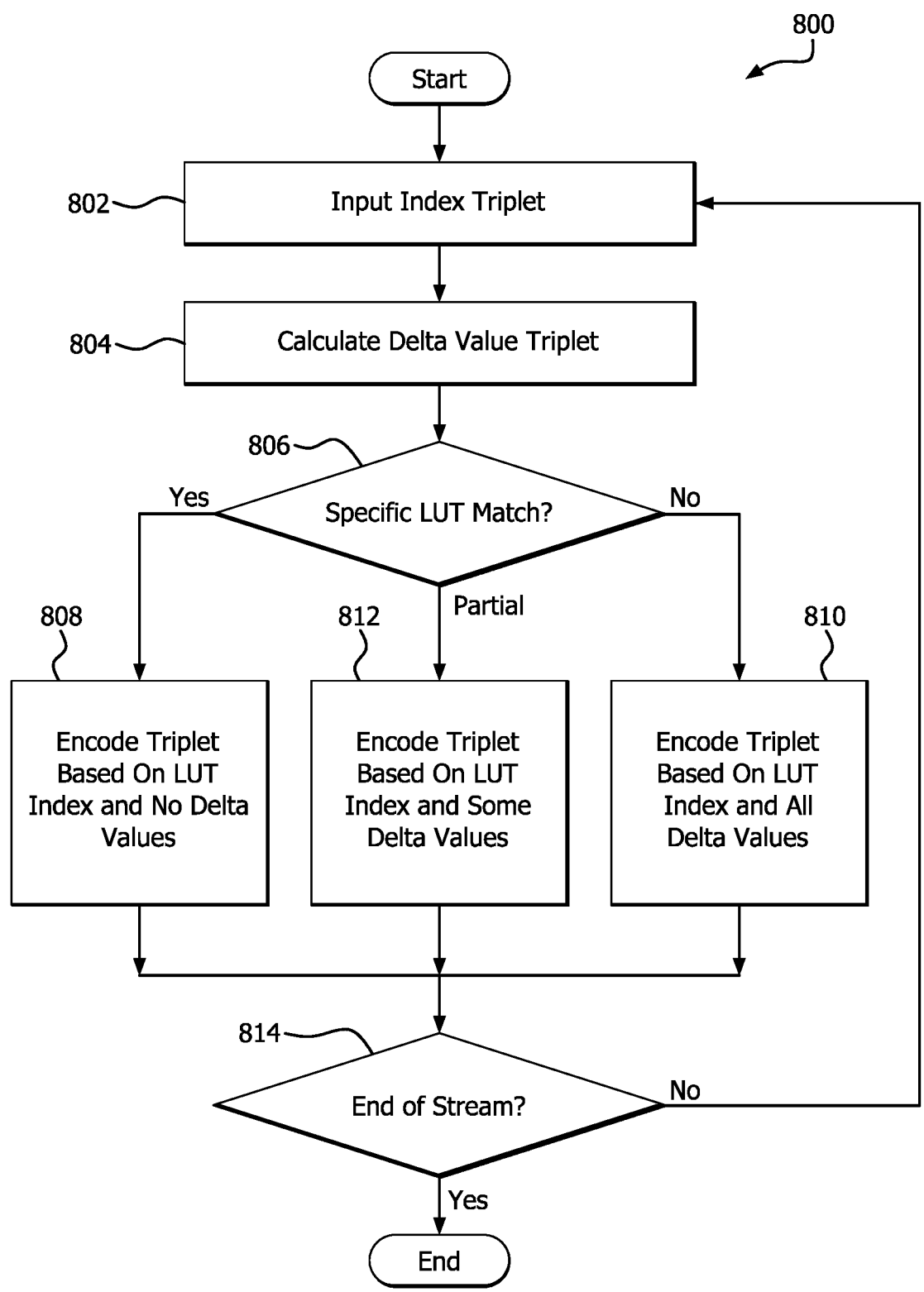
FIG. 8 is a flow chart illustrating an example process for compressing an example index stream.

FIG. 8 is a flow chart illustrating an example process 800 for compressing an example index stream.

In step 802, an index triplet is input to encoding hardware (e.g., a part of rasterization stage 314 as shown and described with respect to FIG. 3) from a stream of primitive indices. A delta value triplet is calculated based on the index triplet in step 804. On condition 806 that the delta values of the index triplet all match specific values of an entry of a common pattern lookup table, the index triplet is compressed in step 808 based on a pattern ID corresponding to (e.g., the index value of) the entry in the common pattern lookup table.

On condition 806 that none of the delta values of the index triplet match specific values of an entry of the common pattern lookup table, the index triplet is compressed in step 810 based on an encoding (e.g., variable length encoding) of the delta values. In some implementations, the index triplet is compressed based on this encoding and a pattern ID (e.g., index value) corresponding to the entry in the common pattern lookup table where each delta value is a "don't care" value (i.e., matches any delta value).

On condition 806 that a subset (e.g., one or two) of the delta values of the index triplet match specific values of an entry of the common pattern lookup table, while the rest do not, the index triplet is compressed in step 812 based on a combination of an encoding (e.g., variable length encoding) of the non-matching delta value or values, and a pattern ID (e.g., index value) corresponding to the entry in the common pattern lookup table which matches the specific delta and "don't care" values. On a condition 814 that the index stream has further index triplets for compression, the flow returns to step 802. Otherwise, the process ends.

Decompression. The techniques discussed above with respect to compression are applicable to decompression. For example, the compressed representation of each triplet (or other group of primitive information in the case of non-triangle primitives) includes or is based on a pattern ID. In some implementations, the decoder decodes the pattern ID to determine how the triplet is compressed. Depending on the pattern ID, the triplet is compressed based on the pattern ID and the previous index, based on the pattern ID, the previous index, and some variable-length encoded delta values, or entirely based on the previous index and variable-length encoded delta values, as indicated by the pattern ID.

Figure 9:
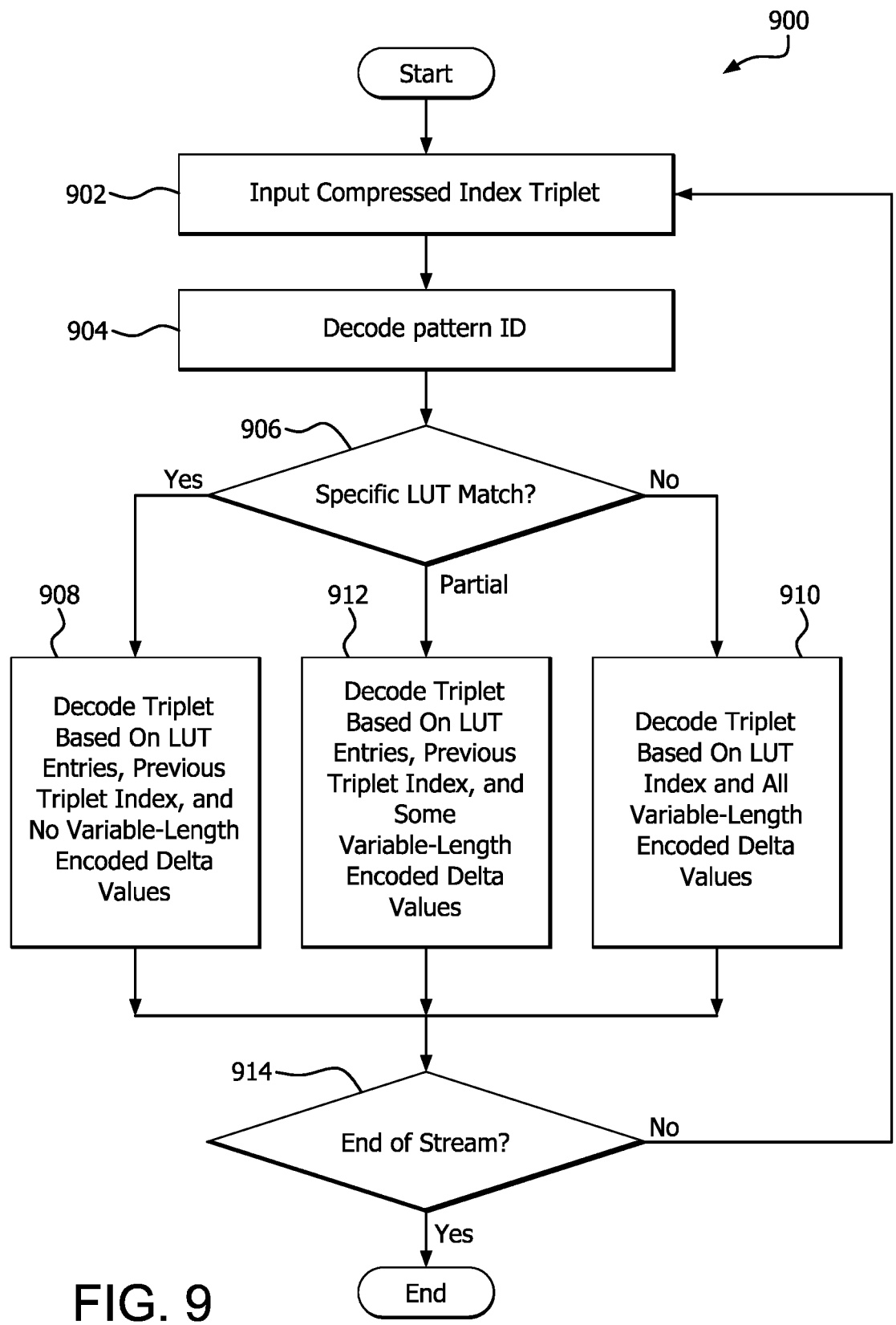
FIG. 9 is a flow chart illustrating an example process for decompressing an example compressed index stream.

FIG. 9 is a flow chart illustrating an example process 900 for decompressing an example compressed index stream, e.g., as compressed according to the techniques described above.

In step 902, a compressed index triplet is input to decoding hardware (e.g., a part of assembler stage 302 as shown and described with respect to FIG. 3) from a compressed stream of primitives. A pattern ID is extracted (e.g., parsed) from the compressed index triplet and decoded in step 904. On condition 906 that the decoded pattern ID indicates that delta values of the index triplet all match specific values of an entry of a common pattern lookup table corresponding to the pattern ID, the index triplet is decompressed in step 908 by decoding the delta values in the common pattern lookup table corresponding to the pattern ID based on the previous triplet index in the stream. In certain cases, such as the first triplet in the stream, the value of the previous triplet index is set to zero in some implementations, or to a different suitable value.

On condition 906 that the decoded pattern ID indicates that no delta values of the index triplet match specific values of an entry of a common pattern lookup table corresponding to the pattern ID, all of the delta values of the compressed index triplet are decompressed in step 910 based on encoded (e.g., variable-length encoded) delta values in the compressed index triplet.

On condition 906 that the decoded pattern ID indicates that a subset (e.g., one or two) of the delta values of the delta triplet match specific values of an entry of the common pattern lookup table corresponding to the pattern ID, while the rest do not, the index triplet is decompressed in step 912 based on a combination of decoding (e.g., variable length decoding) the non-matching delta value or values, and decoding the matching delta values in the common pattern lookup table corresponding to the pattern ID based on the previous triplet index in the stream. On a condition 914 that the index stream has further index triplets for compression, the flow returns to step 902. Otherwise, the process ends.

It is noted that information relating to the primitives other than the index values of the vertices is compressible according to the techniques discussed herein in some implementations.

For example, in some implementations each primitive is associated with an instance identifier (ID) which is compressible. Instancing is a feature in 3D graphics API that allows the same mesh to be rendered multiple times with a single API call. Each instance of a mesh has an instance ID (incrementing by one for each instance), and this ID is used, e.g., for selecting a different transformation matrix or animation frame for each instance of the same mesh. In some cases, such instancing is used for rendering scenes that include the same objects repeated multiple times (i.e., multiple instances). Examples include instances of people in large crowds, instances of trees in forests, and so forth, in some case including some variation between the objects. Because each instance is typically rendered with a different transformation, the primitive visibility can be different for each instance. Accordingly, the visibility data for each instance is stored separately in some implementations, even if the source index data for each instance is the same. Thus, in some implementations, the instance ID changes are embedded into the visibility data. In some implementations, this has the advantage of facilitating straightforward reconstruction of the original instance ID, e.g., without splitting each instanced draw call to multiple draws. Instance ID changes typically do not occur for each primitive (i.e., are typically more sparse than every primitive), although in some cases instanced rendering is used where each rendered instance includes very simple geometry (just a primitive or two, e.g., for particle systems). Because some instances may be fully invisible, the stored instance ID delta between consecutive instances is not always 1 (i.e., can jump forward by a larger amount.)

Referring to FIG. 7, index triplet 702 refers to the vertices of a first primitive, and index triplet 704 refers to the vertices of a second primitive. The first primitive and the second primitive are each associated with an instance ID in some implementations. Similarly to the vertex indices discussed above, the instance IDs exhibit substantial temporal locality in some cases. For example, an instance ID associated with the first primitive may have a value of 100000, while an instance ID associated with the second primitive may have a value of 100001. Although each of these instance IDs may require a plurality of binary bits to represent, the difference between these particular example values is representable using only a single bit (i.e., the difference is 1 in this case, or b1). Accordingly, the instance ID is compressed in the compressed representation (compressed representation 728 using the example of FIG. 7) based on a delta of the instance ID values.

In some implementations, the delta between the instance ID of the first primitive and the instance ID of the second primitive is encoded together with any unmatched deltas (e.g., encoded together with delta values 718, 720, 722 in the variable length encoding of FIG. 7). In some implementations, the instance ID delta alone is encoded as the encoded delta value 732 in cases where there are no unmatched deltas (or other information for variable length encoding).

In some implementations, the common pattern lookup table is configured to accommodate the instance ID delta. For example, in some implementations the common pattern lookup table (e.g., common pattern lookup table 726 in the example of FIG. 7) includes a fourth index to match a combined pattern of instance ID delta and vertex index deltas. In such cases, the instance ID is compressed into a compressed representation (e.g., compressed representation 728 in the example of FIG. 7) by a pattern ID (e.g., pattern ID 730 in the example of FIG. 7) together with any matched vertex index deltas.

It is noted that beyond instance IDs, this technique is extendible to any item or items of information associated with a primitive, such as a primitive ID. A primitive ID identifies each primitive individually, in some implementations. In some implementations a primitive ID identifies a primitive (e.g., as a "running number") within a mesh. For example, in some implementations the primitive ID starts from 0 at the beginning of a mesh and increments by 1 for each primitive. Since the visibility stream includes only some of the primitives, the primitive ID is not a continuously incrementing value after the data has been compressed and decompressed, but may jump forward over a number of values between primitives. In some implementations, this is captured in the compressed index stream so that the data can be played back using the original primitive IDs. In some implementations, such items include integer values, such as integer values having a threshold degree of temporal locality, where the numbers associated with primitives adjacent to one another in the stream are close in value, such as within a threshold value.

It is noted that primitives in the stream having a different number of vertices than the base primitive are also compressible according to the techniques discussed herein in some implementations.

For example, the examples herein are presented with respect to triangle primitives having three vertices, and accordingly, three vertex indices. It is noted however that some implementations also accommodate primitives in the index stream which are defined with respect to a different number of vertex indices. For example, in some implementations, a primitive in the triangle stream includes only 1 or 2 vertex indices (e.g., point and line primitives) or includes 4 or more vertex indices (e.g., rectangle primitives, etc.)

Patch primitives are an example use case for primitives having more than 3 indices. Rectangles are typically used for 2D operations, and in some implementations are defined with 3 vertices, where fourth vertex is calculated from the others. Patch primitives include any number of source vertices (e.g., up to 32 vertices per primitive, depending on the API). Patch primitives are typically tessellated to triangles in the geometry processing pipeline, however the original indices are used, e.g., for storing the index data.

In some implementations, this circumstance is matched to one or more "special" pattern IDs (e.g., specific pattern IDs indicating 1 vertex index, 2 vertex indices, or 4 vertex indices, etc.) by the common pattern lookup table, and delta values of the index vertices are compressed into the compressed representation using variable length encoding as in the cases described above with respect to unmatched deltas. In some implementations, the common pattern LUT is configured to accommodate pattern compression of more than one primitive size. In some such examples, the vertex indices of more than one type of primitive (i.e., primitives having different numbers of vertex indices) are compressible into the compressed representation based on a corresponding pattern ID (and variable length encoding, e.g., if there are unmatched deltas).

In some implementations, primitives having different numbers of vertices are combined to form a triplet (or other base number of vertices). For example, in some implementations, one vertex index from a point primitive is combined with two vertex indices of a line primitive to form at triplet, which is compressed as discussed above regarding delta compression of triplets for triangle primitives.

Typically, there is no need to combine point and line primitives into triplets. Each draw call uses just a single type of primitive, so typically there is a long sequence of a single type. However, this can be implemented, e.g., in cases where only a few visible primitives are visible from such sequence, followed by only a few visible primitives from another sequence with a different type.

Some implementations compress point and line primitives by either storing each primitive as a separate "special case" primitive (having just 1 or 2 index values) instead of using triplets, or by forming several consecutive triplets, where each triplet consists of 3 points (for point primitives) or each two triplets consist of 2 lines (for line primitives). In some such cases, a lone 1-index or 2-index "special case" data entry is used (e.g., at the end of the data) for alignment with total index count of the draw call.

In some implementations, a plurality of streams is compressed and/or decompressed simultaneously. For example, if the same primitive stream is compressed simultaneously for different purposes (e.g., for different bins), the delta calculations within each triplet (e.g., deltas 720, 722 in the example of FIG. 7), will be the same in some implementations. Accordingly, in such cases, only a delta from the previously stored index (e.g., delta 718, calculated from index 710 in the example of FIG. 7) is calculated for each additional stream. In some implementations, the delta to the previously stored index is different for each stream, whereas the triplets are the same for each stream. In some implementations, each triangle is represented by a triplet, and the first delta stored is the difference from the last vertex of the last stored triangle. Since each bin may contain a different set of triangles, the delta to the last stored primitive is different for each bin. The deltas within the triangle (delta between index 0 and index 1, and delta between index 0 to index 2) are however the same for all bins.

It should be understood that many variations are possible based on the disclosure herein. Although features and elements are described above in particular combinations, each feature or element can be used alone without the other features and elements or in various combinations with or without other features and elements.

The various functional units illustrated in the figures and/or described herein (including, but not limited to, the processor 102, the input driver 112, the input devices 108, the output driver 114, the output devices 110, the accelerated processing device 116, the scheduler 136, the graphics processing pipeline 134, the compute units 132, the SIMD units 138, may be implemented as a general purpose computer, a processor, or a processor core, or as a program, software, or firmware, stored in a non-transitory computer readable medium or in another medium, executable by a general purpose computer, a processor, or a processor core. The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method for compressing a stream of indices associated with graphics primitives, the method comprising:
determining a group of delta values based on a group of indices of the stream of indices;
comparing the group of delta values to delta values in a lookup table; and
compressing the group of indices based on an entry in the lookup table if the group of delta values matches all delta values in the entry, otherwise, compressing the group of indices based on variable-length encoding.

2. The method of claim 1, further comprising:
if the group of delta values includes at least one value matching a delta value in an entry in the lookup table, and includes at least one value not matching any delta values in the entry, wherein the at least one value not matching any delta values in the entry corresponds to a don't-care value in the entry, compressing the group of indices based on the entry and based on variable-length encoding of the at least one value not matching any delta values in the entry.

3. The method of claim 1, further comprising:
if the group of delta values does not include at least one value matching a delta value in an entry in the lookup table,
compressing the group of indices based on an entry in the lookup table which includes only don't-care values, and based on variable-length encoding of each of the delta values.

4. The method of claim 1, wherein the group of indices is a triplet and the graphics primitives are triangles.

5. The method of claim 1, wherein the stream of indices indexes vertices of a mesh.

6. A method for decompressing a compressed stream of indices associated with graphics primitives, the method comprising:
comparing a compressed group of indices of the compressed stream of indices to entries of a lookup table; and
if the compressed group of indices matches a lookup table entry that includes delta values corresponding to each of the compressed group of indices, decompressing the compressed group of indices based on the delta values, otherwise, decompressing the compressed group of indices based on variable-length decoding.

7. The method of claim 6, further comprising:
if the compressed group of indices matches a lookup table entry that includes at least one delta value corresponding to at least one of the compressed group of indices, and includes at least one don't-care value corresponding to at least one of the compressed group of indices, decompressing the compressed group of indices based on the at least one delta value and based on variable-length decoding of a delta value corresponding to the at least one don't-care value.

8. The method of claim 6, further comprising:
if the compressed group of indices matches a lookup table entry that includes only don't-care values, decompressing the compressed group of indices based on variable-length decoding of delta values corresponding to each of the compressed group of indices.

9. The method of claim 6, wherein the compressed group of indices is a triplet and the graphics primitives are triangles.

10. The method of claim 6, wherein the compressed stream of indices indexes vertices of a mesh.

11. A compressor configured to compress a stream of indices associated with graphics primitives, the compressor comprising:
circuitry configured to determine a group of delta values based on a group of indices of the stream of indices;
circuitry configured to compare the group of delta values to delta values in a lookup table; and
circuitry configured to compress the group of indices based on an entry in the lookup table if the group of delta values matches all delta values in the entry, otherwise to compress the group of indices based on variable-length encoding.

12. The compressor of claim 11, further comprising:
circuitry configured to, if the group of delta values includes at least one value matching a delta value in an entry in the lookup table, and includes at least one value not matching any delta values in the entry, wherein the at least one value not matching any delta values in the entry corresponds to a don't-care value in the entry, compress the group of indices based on the entry and based on variable-length encoding of the at least one value not matching any delta values in the entry.

13. The compressor of claim 11, further comprising:
circuitry configured to, if the group of delta values does not include at least one value matching a delta value in an entry in the lookup table, compress the group of indices based on an entry in the lookup table which includes only don't-care values, and based on variable-length encoding of each of the delta values.

14. The compressor of claim 11, wherein the group of indices is a triplet and the graphics primitives are triangles.

15. The compressor of claim 11, wherein the stream of indices indexes vertices of a mesh.

16. A decompressor configured to decompress a compressed stream of indices associated with graphics primitives, the decompressor comprising:
circuitry configured to compare a compressed group of indices of the compressed stream of indices to entries of a lookup table; and
circuitry configured to, if the compressed group of indices matches a lookup table entry that includes delta values corresponding to each of the compressed group of indices, decompress the compressed group of indices based on the delta values, otherwise to decompress the compressed group of indices based on variable-length decoding.

17. The decompressor of claim 16, further comprising:
circuitry configured to, if the compressed group of indices matches a lookup table entry that includes at least one delta value corresponding to at least one of the compressed group of indices, and includes at least one don't-care value corresponding to at least one of the compressed group of indices, decompress the compressed group of indices based on the at least one delta value and based on variable-length decoding of a delta value corresponding to the at least one don't-care value.

18. The decompressor of claim 16, further comprising:
circuitry configured to, if the compressed group of indices matches a lookup table entry that includes only don't-care values, decompress the compressed group of indices based on variable-length decoding of delta values corresponding to each of the compressed group of indices.

19. The decompressor of claim 16, wherein the compressed group of indices is a triplet and the graphics primitives are triangles.

20. The decompressor of claim 16, wherein the compressed stream of indices indexes vertices of a mesh.

* * * * *